(12) United States Patent
Murphy et al.

(10) Patent No.: US 11,193,059 B2
(45) Date of Patent: Dec. 7, 2021

(54) PROCESSES FOR PREPARING COLOR STABLE RED-EMITTING PHOSPHOR PARTICLES HAVING SMALL PARTICLE SIZE

(71) Applicant: Current Lighting Solutions, LLC, East Cleveland, OH (US)

(72) Inventors: James Edward Murphy, Niskayuna, NY (US); Srinivas Prasad Sista, Altamont, NY (US); Samuel Joseph Camardello, Niskayuna, NY (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 878 days.

(21) Appl. No.: 15/829,878

(22) Filed: Dec. 2, 2017

(65) Prior Publication Data

US 2018/0163126 A1 Jun. 14, 2018

Related U.S. Application Data

(60) Provisional application No. 62/433,358, filed on Dec. 13, 2016.

(51) Int. Cl.
*C09K 11/61* (2006.01)
*C09K 11/66* (2006.01)
(Continued)

(52) U.S. Cl.
CPC .......... *C09K 11/617* (2013.01); *C09K 11/025* (2013.01); *C09K 11/616* (2013.01);
(Continued)

(58) Field of Classification Search
CPC ... C09K 11/616; C09K 11/617; C09K 11/675; C09K 11/628; C09K 11/645;
(Continued)

(56) References Cited

U.S. PATENT DOCUMENTS 2,803,615 A 8/1957 Ahlbrecht et al.
2,803,656 A 8/1957 Ahlbrecht et al.
(Continued)

FOREIGN PATENT DOCUMENTS

DE 102012022441 A1 5/2014
EP 0073863 A1 3/1983
(Continued)

OTHER PUBLICATIONS

International Search Report and Written Opinion issued in connection with corresponding PCT Application No. PCT/US2017/065795 dated Apr. 12, 2018.
(Continued)

*Primary Examiner* — Matthew E. Hoban
*Assistant Examiner* — Lynne Edmondson
(74) *Attorney, Agent, or Firm* — Buckley, Maschoff & Talwalkar LLC

(57) ABSTRACT

A process for preparing a $Mn^{+4}$ doped phosphor of formula I $$A_x[MF_y]:Mn^{+4} \qquad I$$

includes combining a first solution comprising a source of A and a second solution comprising $H_2MF_6$ in the presence of a source of Mn, to form the $Mn^{+4}$ doped phosphor; wherein
A is Li, Na, K, Rb, Cs, or a combination thereof;
M is Si, Ge, Sn, Ti, Zr, Al, Ga, In, Sc, Y, La, Nb, Ta, Bi, Gd, or a combination thereof;
x is the absolute value of the charge of the $[MF_y]$ ion;
y is 5, 6 or 7; and
wherein a value of a Hammett acidity function of the first solution is at least −0.9.
Particles produced by the process may have a particle size distribution with a $D_{50}$ particle size of less than 10 μm.

14 Claims, 4 Drawing Sheets

(51) Int. Cl.
*C09K 11/62* (2006.01)
*C09K 11/64* (2006.01)
*H01L 33/50* (2010.01)
*C09K 11/02* (2006.01)
*H01L 33/60* (2010.01)
*F21V 8/00* (2006.01)
*H01L 33/62* (2010.01)
*H01L 33/48* (2010.01)

(52) U.S. Cl.
CPC .......... *H01L 33/502* (2013.01); *G02B 6/0073* (2013.01); *H01L 33/483* (2013.01); *H01L 33/60* (2013.01); *H01L 33/62* (2013.01)

(58) Field of Classification Search
CPC ..... C09K 11/665; C09K 11/664; C09K 11/02; C09K 11/0838; C09K 2211/181; C09K 2211/188; H01L 33/502; H01L 33/504; H01L 33/507; H01L 33/52; Y02B 20/181; Y10T 428/2991
USPC ...... 252/301.4 F, 301.4 H, 301.4 R, 301.6 F; 428/403
See application file for complete search history.

(56) References Cited

U.S. PATENT DOCUMENTS

| | | |
|---|---|---|
| 2,809,990 A | 10/1957 | Brown |
| 3,734,962 A | 5/1973 | Niederpruem et al. |
| 3,970,586 A | 7/1976 | Schliebs et al. |
| 4,370,254 A | 1/1983 | Mitschke et al. |
| 5,227,493 A | 7/1993 | Banks |
| 5,326,490 A | 7/1994 | Mori et al. |
| 5,466,389 A | 11/1995 | Ilardi et al. |
| 5,624,541 A | 4/1997 | Pohmer et al. |
| 5,688,884 A | 11/1997 | Baker et al. |
| 5,716,642 A | 2/1998 | Bagchi et al. |
| 5,895,799 A | 4/1999 | Wu et al. |
| 6,036,886 A | 3/2000 | Chhabra et al. |
| 6,280,883 B1 | 8/2001 | Lamanna et al. |
| 6,376,452 B1 | 4/2002 | Flynn et al. |
| 6,664,354 B2 | 12/2003 | Savu et al. |
| 6,858,124 B2 | 2/2005 | Zazzera et al. |
| 6,884,338 B2 | 4/2005 | Kesari et al. |
| 7,524,347 B2 | 4/2009 | Sun et al. |
| 7,776,946 B2 | 8/2010 | Hintzer et al. |
| 8,252,613 B1 | 8/2012 | Lyons et al. |
| 9,388,336 B2 * | 7/2016 | Murphy ................. H01L 33/507 |
| 10,815,423 B2 * | 10/2020 | Porob ................... C01G 23/002 |
| 2003/0001130 A1 | 1/2003 | Qiu |
| 2003/0162399 A1 | 8/2003 | Singh |
| 2004/0089840 A1 | 5/2004 | Parent et al. |
| 2004/0094510 A1 | 5/2004 | Parent et al. |
| 2005/0197273 A1 | 9/2005 | Savu et al. |
| 2007/0015865 A1 | 1/2007 | Hintzer et al. |
| 2012/0256125 A1 * | 10/2012 | Kaneyoshi ............. C01G 23/00 252/301.4 F |
| 2013/0271960 A1 * | 10/2013 | Hong .................... H01L 33/504 362/97.1 |
| 2015/0329770 A1 | 11/2015 | Kaneyoshi et al. |
| 2016/0160122 A1 | 6/2016 | You et al. |
| 2016/0186053 A1 | 6/2016 | Min et al. |

FOREIGN PATENT DOCUMENTS

| | | |
|---|---|---|
| EP | 0561236 A1 | 9/1993 |
| GB | 1599414 A | 9/1981 |
| JP | H05275406 A | 10/1993 |
| KR | 20020084954 A | 11/2002 |
| KR | 10-20120115129 A | 10/2012 |
| WO | 2015/102876 A1 | 7/2015 |
| WO | 2016/141049 A1 | 9/2016 |
| WO | 2016/195937 A1 | 12/2016 |

OTHER PUBLICATIONS

Kikuyama et al., Surface Active Buffered Hydrogen Fluoride Having Excellent Wettability for ULSI Processing, IEEE Transactions on Semiconductor Manufacturing, vol. 3, Issue 3, pp. 99-108, Aug. 1990.

Korean Office Action dated Dec. 4, 2020 which was issued in a counterpart application KR10-2019-7020230 which was filed on Dec. 12, 2017.

* cited by examiner

PROCESSES FOR PREPARING COLOR STABLE RED-EMITTING PHOSPHOR PARTICLES HAVING SMALL PARTICLE SIZE

CROSS-REFERENCE TO RELATED APPLICATIONS

This application is a non-provisional of and claims priority from U.S. provisional application, Ser. No. 62/433,358, filed Dec. 13, 2016, the entire disclosure of which is incorporated herein by reference.

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit in a range between about 610 nm and 658 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation. In addition, use of the red phosphors for displays can yield high gamut and efficiency.

Processes for preparing the materials described in the patent and scientific literature are capable of producing particles having particle size greater than 10 μm, typically with a broad particle size distribution. Examples include Paulusz, A. G., J. Electrochem. Soc., 942-947 (1973), U.S. Pat. Nos. 7,497,973, and 8,491,816. Synthesis of $K_2SiF_6$:$Mn^{4+}$ nanorods is described in Cryst Eng Comm, 2015, 17, 930-936, DOI: 10.1039/C4CE01907E, published online 26 Nov. 2014. However, materials such as nanrods with a high aspect ratio can cause problems in manufacturing LED packaging. In addition, total internal reflection inside a particle with a high aspect ratio may reduce efficiency. US 20160244663 discloses $K_2SiF_6$:$Mn^{4+}$ particles having a D50 particle size ranging from about 10 μm to about 40 μm and a span less than 1.1. Yet there remains a need for processes for preparing the complex fluoride phosphors that can yield a product having a particle size of less than 10 μm, preferably less than 5 μm, with a relatively narrow particle size distribution, with excellent performance in lighting and display applications.

BRIEF DESCRIPTION

Briefly, in one aspect, the present invention relates to processes for preparing a $Mn^{+4}$ doped phosphor of formula I

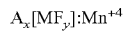

$$A_x[MF_y]:Mn^{+4} \qquad I$$

includes combining a first solution comprising a source of A and a second solution comprising $H_2MF_6$ in the presence of a source of Mn, to form the $Mn^{+4}$ doped phosphor;
wherein
A is Li, Na, K, Rb, Cs, or a combination thereof;
M is Si, Ge, Sn, Ti, Zr, Al, Ga, In, Sc, Y, La, Nb, Ta, Bi, Gd, or a combination thereof;
x is the absolute value of the charge of the $[MF_y]$ ion;
y is 5, 6 or 7; and
wherein a value of a Hammett acidity function of the first solution is at least −0.9.

In another aspect, the present invention relates to $Mn^{4+}$ doped phosphors of formula I in the form of a monodisperse population of particles with a D50 particle size of less than 10 μm, particularly less than 5 μm, and aspect ratio of about 3/1 or less.

In yet another aspect, the present invention relates to microemulsion methods for preparing a coated phosphor having a core comprising a phosphor of formula I and a manganese-free shell comprising a metal fluoride compound disposed on the core. The method includes combining a first microemulsion comprising a phosphor of formula I with a second microemulsion comprising a precursor for a metal fluoride compound, and isolating the coated phosphor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
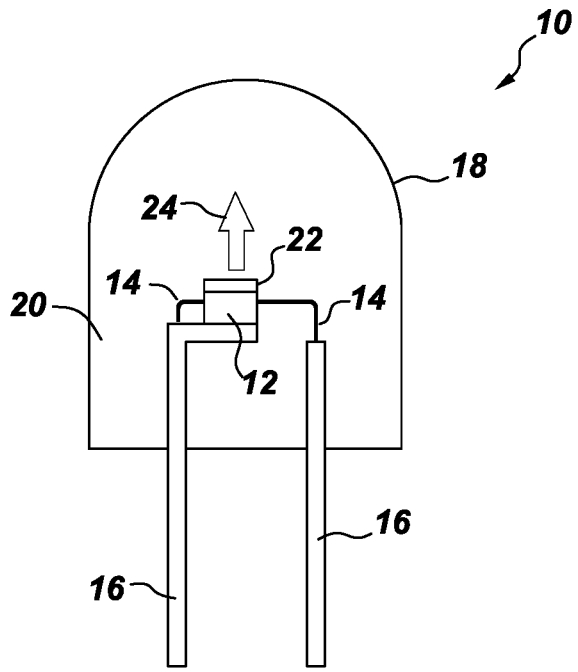
FIG. 1 is a schematic cross-sectional view of a lighting apparatus in accordance with one embodiment of the invention.

The $Mn^{4+}$ doped phosphors of formula I are complex fluoride materials, or coordination compounds, containing at least one coordination center surrounded by fluoride ions acting as ligands, and charge-compensated by counter ions as necessary. For example, in $K_2SiF_6$:$Mn^{4+}$, the coordination center is Si and the counterion is K. Complex fluorides are occasionally written as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

In particular embodiments, the coordination center of the phosphor, that is, M in formula I, is Si, Ge, Sn, Ti, Zr, or a combination thereof. More particularly, the coordination center may be Si, Ge, Ti, or a combination thereof. The counterion, or A in formula I, may be Na, K, or a combination thereof, more particularly K. Examples of phosphors of formula I include $K_2[SiF_6]:Mn^{4+}$, $K_2[TiF_6]:Mn^{4+}$, $K_2[SnF_6]:Mn^{4+}$, $Cs_2[TiF_6]$, $Rb_2[TiF_6]$, $Cs_2[SiF_6]$, $Rb_2[SiF_6]$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the phosphor of formula I is $K_2SiF_6:Mn^{4+}$.

The amount of manganese in the $Mn^{4+}$ doped phosphors of formula I may range from about 1.2 mol % based on the total number of moles of Mn and Si (about 0.3 wt % based on total phosphor weight) to about 21 mol % (about 5.1 wt %), particularly from about 1.2 mol % (about 0.3 wt %) to about 16.5 mol % (about 4 wt %). In particular embodiments, the amount of manganese may range from about 2 mol % (about 0.5 wt %) to 13.4 mol % (about 3.3 wt %), or from about 2 mol % to 12.2 mol % (about 3 wt %), or from about 2 mol % to 11.2 mol % (about 2.76 wt %), or from about 2 mol % to about 10 mol % (about 2.5 wt %), or from about 2 mol % to 5.5 mol % (about 1.4 wt %), or from about 2 mol % to about 3.0 mol % (about 0.75 wt %).

The $Mn^{+4}$ doped phosphors of the present invention comprise a monodisperse population of particles having a D50 particle size of less than 10 µm, particularly, less than 5 µm, more particularly less than 1 µm, even more particularly less than 200 nm, and even more particularly less than 50 nm. The particles have an aspect ratio of less than or equal to 3/1. Aspect ratio is the ratio of the largest dimension of the particle to the smallest dimension orthogonal to it. The aspect ratio of the phosphor particles of the present invention may vary from less than or equal to 3/1, to near unity for a particle having a cubic or dodecahedron form. In addition, the phosphor may be free of hydroxide (OH) groups or carbon, or both hydroxide group-free and carbon-free. The presence of OH groups or organic material that contains C—H bonds may be detected by FT-IR. In some embodiments, span of the particle size distribution is less than 1.1.

The $Mn^{+4}$ doped phosphors of the present invention may be prepared by combining a first solution comprising a source of A and a second solution comprising $H_2MF_6$ in the presence of a source of Mn. The value of the Hammett acidity function $H_0$ of the first solution is at least −0.9, particularly at least −0.5. The Hammett acidity function defines a scale of acidity of strong acids, particularly HF, using the spectroscopically determined concentration of an indicator. The value of the Hammett acidity function is given by equation (1):

$$H_0 = pK_{BH^+} + \log\frac{[B]}{[BH^+]} \quad (1)$$

where

[B] is the concentration of weak base B;

[$BH^+$] is the concentration of the conjugate acid of weak base B; and $pK_{BH+}$ is the dissociation constant of the conjugate acid. Examples of indicating weak bases that may be used to measure the value of the Hammett acidity function of solutions used in the processes of the present invention include the basic indicators shown in Table A.

TABLE A

| Basic Indicator | Basic Strength ($pK_{BH}^+$) |
|---|---|
| 4-Phenylazoaniline | 2.8 |
| 4-(Phenylazo)diphenylamine | 1.5 |
| 4-Nitroaniline | 1.1 |

TABLE A-continued

| Basic Indicator | Basic Strength ($pK_{BH}^+$) |
|---|---|
| 2-Nitroaniline | −0.2 |
| 4-Chloro-2-nitroaniline | −0.9 |
| 4-Nitrodiphenylamine | −2.4 |
| 2,4-Dichloro-6-nitroaniline | −3.2 |
| 4-Nitroazobenzene | −3.3 |
| 2,6-Dinitro-4-methylaniline | −4.3 |
| 2,4-Dinitroaniline | −4.4 |
| N,N-Dimethyl-2,4,6-trinitroaniline solution in conc. $H_2SO_4$ | −4.7 |
| Chalcone | −5.6 |
| 2-Benzoylnaphthalene | −5.9 |
| 4-Benzoylbiphenyl | −6.2 |
| 2-Bromo-4,6-dinitroaniline | −6.6 |
| Anthraquinone | −8.1 |
| 2,4,6-Trinitroaniline, solution in conc. $H_2SO_4$ | −9.3 |

Methods for determining the value of the Hammett acidity function of aqueous HF solutions are known. For example, the value of the Hammett acidity function of concentrated aqueous HF solutions has been determined by Hyman et al. (J. Am. Chem. Soc., 1957, 79 (14), pp 3668-3671).

The concentration of the source of A in the first solution may be at least 6M, particularly at least 7.8M. The solvent for the first and second solutions may be aqueous HF, for example 48% HF in water. In some embodiments, the first solution is free of HF. In the HF-free solutions, the solvent may be water, a non-solvent or antisolvent for the phosphor product, or a combination thereof. Suitable materials that are non-solvents or antisolvents include acetone, acetic acid, isopropanol, ethanol, methanol, acetonitrile, dimethyl formamide, and combinations thereof.

The molar ratio of A to M may be at least 5/1, and in particular embodiments may be at least 7/1, or at least 8/1, or at least 9/1. That is, the ratio of the total number of moles of the source of A in the first solution to the total number of moles of $H_2MF_6$ in the second solution may be at least 5/1, and in particular embodiments may be at least 7/1, 7/1, or at least 8/1, or at least 9/1.

The processes according to the present invention may be batch or continuous processes. For batch processes, the second solution is combined with at least 50% by volume of the first solution, particularly at least 75% by volume, over a period of less than 30 seconds, preferably less than 10 seconds, more preferably less than about 5 seconds. For continuous processes, the first solution and the second solution are gradually added to a reactor in the presence of a source of Mn to form a product liquor. The value of Hammett acidity function of the first solution is at least −1.3, of the second solution is at least −3, and the volume ratio of 35% $H_2SiF_6$ to 49% HF in the second solution is at least 1:2.5. In particular, the ratio is at least 1:2.2. During the addition, the product liquor is gradually discharged from the reactor while maintaining a constant volume, particularly a volume of less than 100 ml. US 2016/0244663 describes continuous processes for preparing the phosphors of formula I. In some embodiments, the reactor may be precharged with a material selected from HF, a source of A, preformed particles of the $Mn^{+4}$ doped phosphor or the undoped host material, or a combination thereof.

The second solution includes a source of M and may additionally include aqueous HF. The source of M may be a compound containing Si, having good in solubility in the solution, for example, $H_2SiF_6$, $Na_2SiF_6$, $(NH_4)_2SiF_6$, $Rb_2SiF_6$, $Cs_2SiF_6$, $SiO_2$ or a combination thereof, particularly $H_2SiF_6$. Use of $H_2SiF_6$ is advantageous because it has very high solubility in water, and it contains no alkali metal element as an impurity. The source of M may be a single compound or a combination of two or more compounds. The HF concentration in the first solution may be at least 15 wt %, particularly at least 25 wt %, more particularly at least 30 wt %. Water may be added to the first solution, reducing the concentration of HF, to decrease particle size and improve product yield. Concentration of the material used as the source of M may be ≤25 wt %, particularly ≤15 wt %.

The second solution may also include a source of Mn, and may also include aqueous HF as a solvent. Suitable materials for use as the source of Mn include for example, $K_2MnF_6$, $KMnO_4$, $K_2MnCl_6$, $MnF_4$, $MnF_3$, $MnF_2$, $MnO_2$, and combinations thereof, and, in particular, $K_2MnF_6$ Concentration of the compound or compounds used as the source of Mn is not critical; and is typically limited by its solubility in the solution. The HF concentration in the second solution may be at least 15 wt %, particularly at least 30 wt %.

Amounts of the raw materials used generally correspond to the amounts of each component in the desired composition, except that an excess of the source of A may be present. Flow rates may be adjusted so that the sources of M and Mn are added in a roughly stoichiometric ratio while the source of A is in excess of the stoichiometric amount. In many embodiments, the source of A is added in an amount ranging from about 150% to 300% molar excess, particularly from about 175% to 300% molar excess. For example, in Mn-doped $K_2SiF_6$, the stoichiometric amount of K required is 2 moles per mole of Mn-doped $K_2SiF_6$, and the amount of KF or $KHF_2$ used may range from about 3.5 moles to about 6 moles of the product phosphor.

The source of A may be a single compound or a mixture of two or more compounds. Suitable materials include KF, $KHF_2$, $KC_6H_7O_7$ (potassium citrate), KOH, KCl, KBr, KI, $KHSO_4$, $KOCH_3$, $K_2S_2O_8$, or $K_2CO_3$, particularly KF, $KHF_2$, potassium citrate, or a combination thereof, more particularly KF. A source of Mn that contains K, such as $K_2MnF_6$, may be a source of K, particularly in combination with KF, $KHF_2$, potassium citrate, or a combination thereof. The source of A may be present in either or both of the first and second solutions, in a third solution added separately, in the reactor pot, or in a combination of one or more of these.

One or both of the first and second solutions may additionally include one or more chelating agents, for example, ammonium citrate, potassium citrate, iminodiacetic acid (IDA), and EDTA. In some embodiments, the first or second solution may contain potassium citrate as a source of A. Processes that include a chelating agent such as potassium citrate may yield $Mn^{4+}$ doped phosphor particles having a particle size distribution with a $D_{50}$ particle size in the submicron range; particle size as measured by transmission electron microscopy (TEM) may be less than 1 μm, particularly less than 200 nm, more particularly less than 50 nm.

One or both of the first and second solutions may additionally include one or more surfactants. Surfactants suitable for use in the processes of the present invention include nonionic, anionic and cationic surfactants, including, but not limited to, aliphatic amines such as cetyltrimethylammonium bromide (CTAB), fluorocarbon surfactants, stearic acid and stearate salts, and oleic acid and oleate salts. Suitable nonionic surfactants include polyoxyethylene sorbitan fatty acid esters, commercially available under the TWEEN® brand, fluorocarbon surfactants such as NOVEC™ ammonium fluoroalkylsulfonamide, available from 3M, and polyoxyethylene nonylphenol ethers. Additional examples of suitable surfactants are described in US 2015/0329770, U.S. Pat. No. 7,985,723 and Kikuyarna, et al., IEEE Transactions on Semiconductor Manufacturing, vol. 3, No. 3, Aug. 1990, pp. 99-108.

In some embodiments, either or both of the first and second solutions may be a microemulsion. The microemulsion is composed of an organic phase and an aqueous phase, with at least one surfactant as an emulsifying agent. The organic phase may include one or more organic solvents; suitable solvents include, but are not limited to, octanol, hexadecane, octadecane, octadecene, phenyldodecane, phenyltetradecane, or phenylhexadecane. The aqueous phase includes the sources of A, M, and Mn described above and an aqueous solvent, for example, aqueous HF or $H_2SiF_6$. The microemulsion may additionally include one or more cosurfactants such as $C_4$-$C_{10}$ amines and alcohols, and/or one or more chelating agents. The proportions of the components of the solutions may be adjusted so that they are above the critical micelle concentration. The microemulsion may be a reverse microemulsion composed of reverse micelles containing an aqueous solvent and the sources of A, M, and Mn, dispersed in an organic solvent. Microemulsion processes are capable of producing Medoped phosphor particles having a particle size distribution with a $D_{50}$ particle size in the submicron range; $D_{50}$ particle size as measured by transmission electron microscopy (TEM) may be less than 1 μm, particularly less than 200 nm.

After the product liquor is discharged from the reactor, the $Mn^{+4}$ doped phosphor may be isolated from the product liquor by simply decanting the solvent or by filtration, and treated as described in U.S. Pat. Nos. 8,252,613, 8,710,487, or U.S. Pat. No. 9,399,732, with a concentrated solution of a compound of formula II in aqueous hydrofluoric acid;

$$A^1_x[MF_y] \qquad\qquad II$$

wherein $A^1$ is H, Li, Na, K, Rb, Cs, or a combination thereof;

M is Si, Ge, Sn, Ti, Zr, Al, Ga, In, Sc, Y, La, Nb, Ta, Bi, Gd, or a combination thereof;

x is the absolute value of the charge of the [$MF_y$] ion; and y is 5, 6 or 7.

The compound of formula II includes at least the $MF_y$ anion of the host compound for the product phosphor, and may also include the $A^+$ cation of the compound of formula I. For a product phosphor of formula $K_2SiF_6$:Mn, suitable materials for the compound of formula II include $H_2SiF_6$, $Na_2SiF_6$, $(NH_4)_2SiF_6$, $Rb_2SiF_6$, $Cs_2SiF_6$, or a combination thereof, particularly $H_2SiF_6$, $K_2SiF_6$ and combinations thereof, more particularly $K_2SiF_6$ The treatment solution is a saturated or nearly saturated of the compound of formula II in hydrofluoric acid. A nearly saturated solution contains about 1-5% excess aqueous HF added to a saturated solution. Concentration of HF in the solution ranges from about 25% (wt/vol) to about 70% (wt/vol), in particular from about 40% (wt/vol) to about 50% (wt/vol). Less concentrated solutions may result in reduced performance of the phosphor. The amount of treatment solution used ranges from about 2-30 ml/g product, particularly about 5-20 ml/g product, more particularly about 5-15 ml/g product.

The treated phosphor may be vacuum filtered, and washed with one or more solvents to remove HF and unreacted raw materials. Suitable materials for the wash solvent include acetic acid and acetone, and combinations thereof.

Span is a measure of the width of the particle size distribution curve for a particulate material or powder, and is defined according to equation (2):

$$\text{Span} = \frac{(D_{90} - D_{10})}{D_{50}} \qquad (2)$$

wherein $D_{50}$ is the median particle size for a volume distribution;

$D_{90}$ is the particle size for a volume distribution that is greater than the particle size of 90% of the particles of the distribution; and $D_{10}$ is the particle size for a volume distribution that is greater than the particle size of 10% of the particles of the distribution.

Particle size of the phosphor powder may be conveniently measured by laser diffraction or optical microscopy methods, and commercially available software can generate the particle size distribution and span. For phosphor particles of the present invention, the D50 particle size is less than 10 µm, particularly less than 5 µm. Span of the particle size distribution is not necessarily limited, and may be ≤1.0 in some embodiments.

After the product phosphor is isolated from the product liquor, treated and dried, it may be annealed to improve stability as described in U.S. Pat. No. 8,906,724. In such embodiments, the product phosphor is held at an elevated temperature, while in contact with an atmosphere containing a fluorine-containing oxidizing agent. The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, $KrF_2$, $XeF_2$, $XeF_4$, $XeF_6$, $NF_3$, $SiF_4$, $PbF_2$, $ZnF_2$, $SnF_2$, $CdF_2$ $CdF_2$, a $C_1$-$C_4$ fluorocarbon, or a combination thereof. Examples of suitable fluorocarbons include $CF_4$, $C_2F_6$, $C_3F_8$, $CHF_3$, $CF_3CH_2F$, and $CF_2CHF$. In particular embodiments, the fluorine-containing oxidizing agent is $F_2$. The amount of oxidizing agent in the atmosphere may be varied to obtain a color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In particular embodiments, the atmosphere is composed of about 20% $F_2$ and about 80% nitrogen.

The temperature at which the phosphor is contacted with the fluorine-containing oxidizing agent is any temperature in the range from about 200° C. to about 700° C., particularly from about 350° C. to about 600° C. during contact, and in some embodiments from about 500° C. to about 600° C. The phosphor is contacted with the oxidizing agent for a period of time sufficient to convert it to a color stable phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours. After holding at the elevated temperature for the desired period of time, the temperature in the furnace may be reduced at a controlled rate while maintaining the oxidizing atmosphere for an initial cooling period. The temperature may be reduced to about 200° C. with controlled cooling, then control may be discontinued if desired.

The manner of contacting the phosphor with the fluorine-containing oxidizing agent is not critical and may be accomplished in any way sufficient to convert the phosphor to a color stable phosphor having the desired properties. In some embodiments, the chamber containing the phosphor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

The annealed phosphor may be treated with a saturated or nearly saturated solution of a composition of formula II in aqueous hydrofluoric acid, as described above. The amount of treatment solution used ranges from about 10 ml/g product to 20 ml/g product, particularly about 10 ml/g product. The treated annealed phosphor may be isolated by filtration, washed with solvents such as acetic acid and acetone to remove contaminates and traces of water, and stored under nitrogen.

After treatment, the phosphor may be contacted with a fluorine-containing oxidizing agent in gaseous form at a second, lower temperature. The second temperature may the same as the first temperature, or may be less than the it, ranging up to and including 225° C., particularly up to and including 100° C., and more particularly, up to and including 90° C. The time for contacting with the oxidizing agent may be at least one hour, particularly at least four hours, more particularly at least six hours, and most particularly at least eight hours. In a specific embodiment, the phosphor is contacted with the oxidizing agent for a period of at least eight hours at a temperature of about 90° C. The oxidizing agent may be the same as or different from that used in the first annealing step. In particular embodiments, the fluorine-containing oxidizing agent is $F_2$. More particularly, the atmosphere may include at least 20% $F_2$. The phosphor may be contained in a vessel having a non-metallic surface in order to reduce contamination of the phosphor with metals.

In another aspect, the present invention relates to microemulsion methods for preparing coated phosphor particles that include a coated phosphor having a core comprising a phosphor of formula I and a manganese-free shell comprising a metal fluoride compound disposed on the core The materials may be prepared by distributing the phosphor of formula I or precursor(s) for the phosphor and precursor(s) for the metal fluoride among two or more microemulsions and then combining them. In particular embodiments, the precursor includes an element selected from the group consisting of calcium, strontium, magnesium, barium, yttrium, scandium, lanthanum, and combinations thereof. Suitable solvents for the organic phase include, but are not limited to, octanol, hexadecane, octadecane, octadecene, phenyldodecane, phenyltetradecane, or phenylhexadecane. The aqueous phase includes an aqueous solvent, for example, aqueous HF or $H_2SiF_6$, in addition to the phosphor and precursors. The microemulsion may additionally include one or more cosurfactants such as $C_4$-$C_{10}$ amines and alcohols, and/or one or more chelating agents. The proportions of the components of the solutions may be adjusted so that they are above the critical micelle concentration. The microemulsion may be a reverse microemulsion composed of reverse micelles containing the aqueous phase dispersed in the organic phase. In particular embodiments, the metal fluoride compound is $KMgF_3$. A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAk_kN$ (where $0 \le i$; $0 \le j$; $0 \le k$, and $i+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
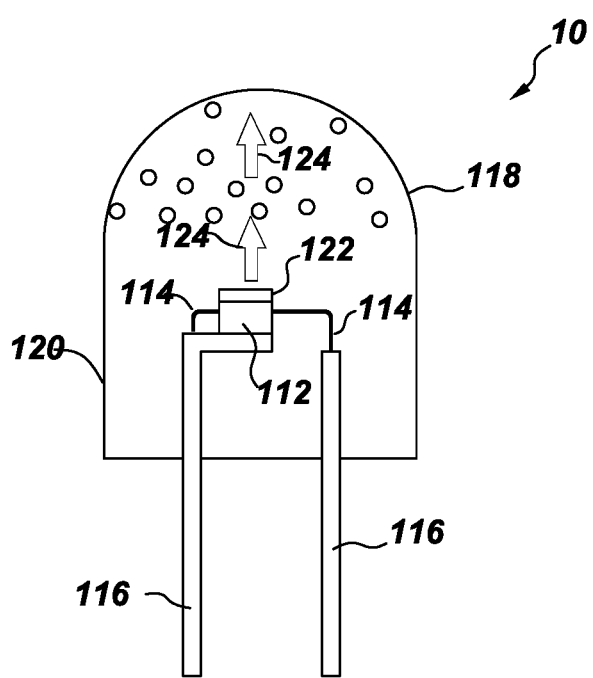
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
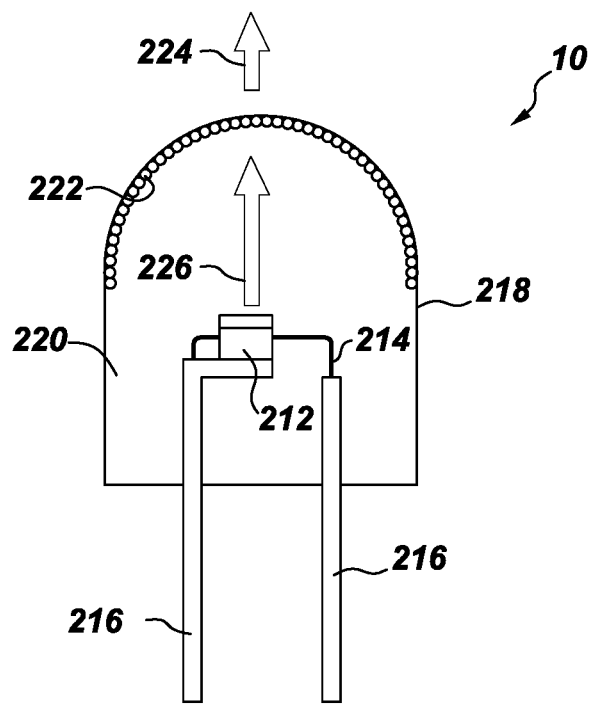
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, silica, alumina, zirconia, titania, or a combination thereof. The scattering particles effectively scatter the directional light emitted from the LED chip, preferably with a negligible amount of absorption.

Figure 4:
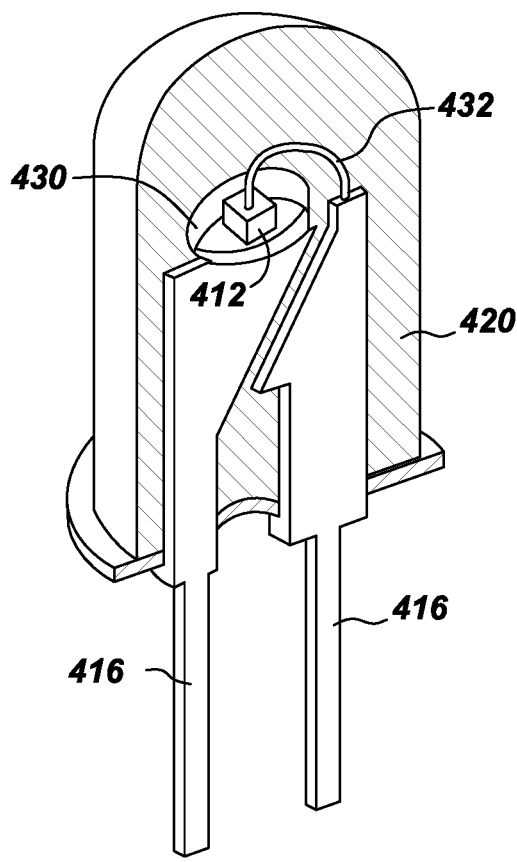
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as silica, alumina, zirconia, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
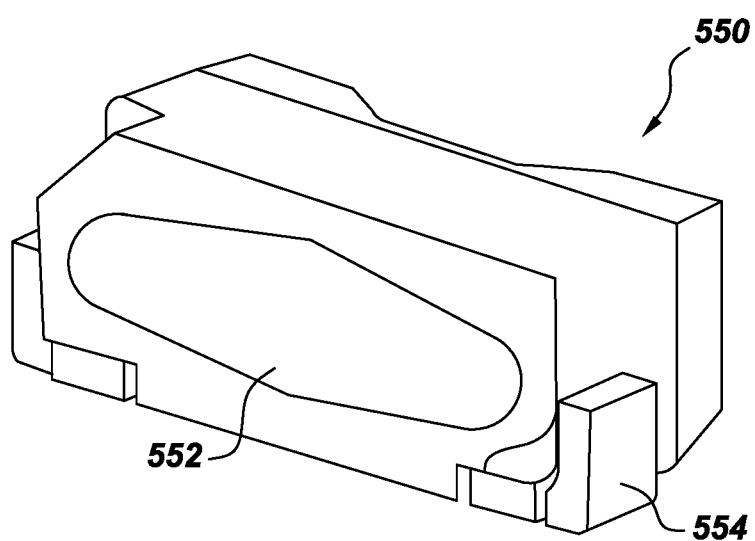
FIG. 5 is a schematic perspective view of a surface-mounted device (SMD) backlight LED.

Another structure is a surface mounted device ("SMD") type light emitting diode 550, e.g. as illustrated in FIG. 5. This SMD is a "side-emitting type" and has a light-emitting window 552 on a protruding portion of a light guiding member 554 and is particularly useful for backlight applications. An SMD package may comprise an LED chip as defined above, and a phosphor material that is excited by the light emitted from the LED chip.

In some embodiments, the Mdoped phosphors according to the present invention are used in direct emission display devices that include arrays of microLEDs having dimensions on the scale of 1 to 300 µm or, more specifically, 1 to 100 µm, and even the scale of 1 to 50 µm, 1 to 20 µm, or 1 to 10 µm. Exemplary methods for fabricating direct emission display devices that include phosphor particles in a wavelength conversion layer coupled to the microLEDs are described in U.S. Pat. No. 9,111,464, assigned to Lux Vue Technology Corporation, and U.S. Pat. No. 9,627,437, assigned to Sharp Laboratories of America, Inc. Devices that include a backlight unit or direct emission display according to the present invention include, but are not limited to, TVs, computers, smartphones, tablet computers and other handheld devices that have a display including a semiconductor light source; and a $Mn^{4+}$ doped phosphor according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, silica, alumina, zirconia, titania, or a combination thereof. The scattering particles effectively scatter the directional light emitted from the LED chip, preferably with a negligible amount of absorption.

Devices according to the present invention may include one or more other light emitting materials in addition to a $Mn^{4+}$ doped phosphor. When used in a lighting apparatus in combination with a blue or near UV LED emitting radiation in the range of about 250 to 550 nm, the resultant light emitted by the assembly may be a white light. Other phosphors or quantum dot (QD) materials, such as green, blue, yellow, red, orange, or other color phosphors or QD materials may be used in a blend to customize the color of the resulting light and produce specific spectral power distributions. In other embodiments, the materials may be physically separated in a multilayered structure, or may be present in one or more blends in a multilayered structure. In FIGS. 1-5, phosphor composition 22 may be a single layer blend or a multilayered structure containing one or more phosphors or QD materials in each layer. In microLED direct emission display devices, individual microLEDs may be separately coupled to a $Mn^{4+}$ doped phosphor and other phosphors or quantum dot (QD) materials to yield light having desired specifications.

Suitable phosphors for use in devices according to the present invention, along with a $Mn^{4+}$ doped phosphor include, but are not limited to:

$((Sr_{1-z}(Ca,Ba,Mg,Zn)_z)_{1-(x+w)}(Li,Na,K,Rb)_wCe_x)_3(Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$;

$(Ca,Ce)_3Sc_2Si_3O_{12}$ (CaSiG);
$(Sr,Ca,Ba)_3Al_{1-x}Si_xO_{4+x}F_{1-x}:Ce^{3+}$(SASOF));
$(Ba,Sr,Ca)_5(PO_4)_3(Cl,F,Br,OH):Eu^{2+},Mn^{2+}$;
$(Ba,Sr,Ca)BPO_5:Eu^{2+},Mn^{2+}$;
$(Sr,Ca)_{10}(PO_4)_6 * nB_2O_3:Eu^{2+}$ (wherein $0<n\leq1$);
$Sr_2Si_3O_8 * 2SrCl_2:Eu^{2+}$; $(Ca,Sr,Ba)_3MgSi_2O_8:Eu^{2+},Mn^{2+}$;
$BaAl_8O_{13}:Eu^{2+}$; $2SrO * 0.84P_2O_6 * 0.16B_2O_3:Eu^{2+}$; $(Ba,Sr,Ca)MgAl_{10}O_{17}:Eu^{2+},Mn^{2+}$;
$(Ba,Sr,Ca)Al_2O_4:Eu^{2+}$; $(Y,Gd,Lu,Sc,La)BO_3:Ce^{3+},Tb^{3+}$;
$ZnS:Cu+,Cl^-$; $ZnS:Cu^+,Al^{3+}$; $ZnS:Ag^+,Cl^-$; $ZnS:Ag^+,Al^{3+}$;
$(Ba,Sr,Ca)_2Si_{1-n}O_{4-2n}:Eu^{2+}$ (wherein $0\leq n\leq0.2$); $(Ba,Sr,Ca)_2(Mg,Zn)Si_2O_7:Eu^{2+}$;
$(Sr,Ca,Ba)(Al,Ga,In)_2S_4:Eu^{2+}$;
$(Y,Gd,Tb,La,Sm,Pr,Lu)_3(Al,Ga)_{5-a}O_{12-3/2a}:Ce^{3+}$ (wherein $0\leq a\leq0.5$);
$(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$;
$(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$;
$(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$;
$(Y,Lu)_2WO_6:Eu^{3+},Mo^{6+}$;
$(Ba,Sr,Ca)_bSi_9N_m:Eu^{2+}$ (wherein $2b+4g=3m$); $Ca_3(SiO_4)Cl_2:Eu^{2+}$;
$(Lu,Sc,Y,Tb)_{2-u-v}Ce_vCa_{1+u}Li_wMg_{2-w}P_w(Si,Ge)_{3-w}O_{12-u/2}$ (where $-0.5\leq u\leq1$, $0<v\leq0.1$, and $0\leq w\leq0.2$);
$(Y,Lu,Gd)_{2-m}(Y,Lu,Gd)Ca_mSi_4N_{6+m}C_{1-m}:Ce^{3+}$, (wherein $0\leq m\leq0.5$);
$(Lu,Ca,Li,Mg,Y)$, α-SiAlON doped with $Eu^{2+}$ and/or $Ce^{3+}$; $(Ca,Sr,Ba)SiO_2N_2:Eu^{2+},Ce^{3+}$;
β-SiAlON:$Eu^{2+}$, $Ba[Li_2(Al_2Si_2)N_6]:Eu^{2+}$, $3.5MgO * 0.5MgF_2 * GeO_2:Mn^{4+}$;
$(Ca,Sr)_{1-c-f}Ce_cEu_fAl_{1+c}Si_{1-c}N_3$, (where $0\leq c\leq0.2$, $0\leq f\leq0.2$);
$Ca_{1-h-r}Ce_hEu_rAl_{1-h}(Mg,Zn)_hSiN_3$, (where $0\leq h\leq0.2$, $0\leq r\leq0.2$);
$Ca_{1-2s-t}Ce_s(Li,Na)_sEu_tAlSiN_3$, (where $0\leq s\leq0.2$, $0\leq t\leq0.2$, $s+t>0$); $(Sr,Ca)AlSiN_3$: $Eu^{2+},Ce^{3+}$(CASN); $(Ba,Sr)_2Si_5N_8:Eu^{2+}$; $Sr[LiAl_3N_4]:Eu^{2+}$; and $Sr[Mg_3SiN_4]:Eu^{2+}$.

QD materials for use in devices according to the present invention may be a group II-VI compound, a group III V compound, a group IV-IV compound, a group IV compound, a group I-III-VI$_2$ compound or a combination thereof. Examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof. Examples of group III-V compounds include GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations therof. Examples of group IV compounds include Si, Ge, SiC, and SiGe. Examples of group I-III-VI$_2$ chalcopyrite-type compounds include CuInS$_2$, CuInSe$_2$, CuGaS$_2$, CuGaSe$_2$, AgInS$_2$, AgInSe$_2$, AgGaS$_2$, AgGaSe$_2$ and combinations thereof.

The QD materials may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2(S, Se, Te)_3$, $Al_2CO$, and appropriate combinations of two or more such materials. Exemplary core-shell QDs include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS and CdTe/ZnS.

The QD materials typically include ligands conjugated to, cooperated with, associated with, or attached to their surface. In particular, the QDs may include a coating layer comprising ligands to protect the QDs from environmental conditions including elevated temperatures, high intensity light, external gasses, and moisture, control aggregation, and allow for dispersion of the QDs in the matrix material.

In particular, phosphor composition 22 may include one or more phosphors that result in a green spectral power distribution under ultraviolet, violet, or blue excitation. In the context of the present invention, this is referred to as a green phosphor or green phosphor material. The green phosphor may be a single composition or a blend that emits light in a green to yellow-green to yellow range, such as cerium-doped yttrium aluminum garnets, more particularly $(Y,Gd,Lu,Tb)_3(Al,Ga)_5O_{12}:Ce^{3+}$. The green phosphor may also be a blend of blue- and red-shifted garnet materials. For example, a $Ce^{3+}$-doped garnet having blue shifted emission may be used in combination with a $Ce^{3+}$-doped garnet that has red-shifted emission, resulting in a blend having a green spectral power distribution. Blue- and red-shifted garnets are known in the art. In some embodiments, versus a baseline $Y_3Al_5O_{12}:Ce^{3+}$ phosphor, a blue-shifted garnet may have $Lu^{3+}$ substitution for $Y^{3+}$, $Ga^{3+}$ substitution for $Al^{3+}$, or lower $Ce^{3+}$ doping levels in a $Y_3Al_5O_{12}:Ce^{3+}$ phosphor composition. A red-shifted garnet may have $Gd^{3+}/Tb^{3+}$ substitution for $Y^{3+}$ or higher $Ce^{3+}$ doping levels. An example of a green phosphor that is particularly useful for display applications is β-SiAlON. In some embodiments, lighting apparatus 10 has a color temperature less than or equal to 4200° K, and the only red phosphor present in phosphor composition 22 is the $Mn^{4+}$ doped phosphor; in particular, $K_2SiF_6:Mn^{4+}$. The composition may additionally include a green phosphor. The green phosphor may be a $Ce^{3+}$-doped garnet or blend of garnets, particularly a $Ce^{3+}$-doped yttrium aluminum garnet, and more particularly, YAG having the formula $(Y,Gd,Lu,Tb)_3(Al,Ga)_5O_{12}:Ce^{3+}$. When the red phosphor is $K_2SiF_6:Mn^{4+}$, the mass ratio of the red phosphor to the green phosphor material may be less than 3.3, which may be significantly lower than for red phosphors of similar composition, but having lower levels of the Mn dopant.

The ratio of each of the individual phosphors in a phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram, and a white light is preferably produced. This white light may, for instance, may possess an x value in the range of about 0.20 to about 0.55, and a y value in the range of about 0.20 to about 0.55. However, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination. The list of potential phosphor for blending given here is not meant to be exhaustive and these $Mn^{4+}$-doped phosphors can be blended with various phosphors with different emission to achieve desired spectral power distributions.

Other materials suitable for use in devices according to the present invention include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

The $Mn^{4+}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

Example 1: Baseline Process
(C070616ATGAT(205))

Solution A was prepared by slowly adding 15.6 g of KF to a polypropylene beaker that contained 22.3 mL 49% HF. Caution as this process is exothermic. The solution was stirred magnetically for 5 minutes. Solution B was prepared by adding 13.4 mL of 35% $H_2SiF_6$ to 71 mL of 49% HF in a 500 mL polypropylene beaker. While the solution was stirred magnetically at 300 RPM, 1.8 g of $K_2MnF_6$ was added.

The contents of beaker A were quickly poured into Solution B and the resulting suspension is stirred for 3 minutes. The stirring is stopped, the supernatant is decanted, and the slurry is vacuum filtered, and washed for 15 minutes in a nearly saturated solution of $K_2SiF_6$ in 49% HF. After the 15 minute washing step, stirring is stopped, the supernatant is decanted and the slurry is vacuum filtered, rinsed once with 75 mL glacial acetic acid and three times with 75 mL of acetone. The solid is dried for more than 30 minutes under vacuum and then annealed at 540° C. for 8 hours under a 20% fluorine:80% nitrogen atmosphere. The annealed powder is sifted through 280 mesh and then washed in a nearly saturated solution of $K_2SiF_6$ in 49% HF for 30 minutes. After the 30 minute washing step, stirring is stopped, the supernatant is decanted and the slurry is vacuum filtered, rinsed once with 75 mL glacial acetic acid, three times with 75 mL of acetone and then dried under vacuum.

Example 2: Solution A of Higher Concentration (C070616BTGAT(205))

Solution A was prepared by adding 23.8 g of KF to a polypropylene beaker that contained 34 mL 49% HF. Caution as this process is exothermic. The solution was stirred magnetically for 5 minutes. Solution B was prepared by adding 13.4 mL of 35% $K_2SiF_6$ was added to 71 mL of 49% HF in a 500 mL polypropylene beaker. While the solution was stirred magnetically at 300 RPM, 1.8 g of $K_2MnF_6$ was added.

The contents of Solution A were quickly poured into Solution B and the resulting suspension was stirred for 3 minutes. The stirring was stopped, the supernatant was decanted, and the slurry was vacuum filtered, rinsed with acetic acid and acetone, washed for 15 minutes in a nearly saturated solution of $K_2SiF_6$ in 49% HF. After the 15 minute washing step, stirring was stopped, the supernatant was decanted and the slurry was vacuum filtered, rinsed once with 75 mL glacial acetic acid and three times with 75 mL of acetone. The solid was dried for more than 30 minutes under vacuum and then annealed at 540° C. for 8 hours under a 20% fluorine:80% nitrogen atmosphere. The annealed powder was sifted through 280 mesh and then washed in a nearly saturated solution of $K_2SiF_6$ in 49% HF for 30 minutes. After the 30 minute washing step, stirring was stopped, the supernatant was decanted and the slurry was vacuum filtered, rinsed once with 75 mL glacial acetic acid, three times with 75 mL of acetone and then dried under vacuum.

Example 3: Solution A of Lower Concentration (C070616CTGAT(205))

Solution A was prepared by slowly adding 15.6 g of KF to a polypropylene beaker that contained 44 mL 49% HF. Caution as this process is exothermic. The solution was stirred magnetically for 5 minutes. Solution B was prepared by adding 13.4 mL of 35% $H_2SiF_6$ to 71 mL of 49% HF in a 500 mL polypropylene beaker. While the solution was stirred magnetically at 300 RPM, 1.8 g of $K_2MnF_6$ was added.

The contents of beaker A were quickly poured into beaker B and the resulting suspension is stirred for 3 minutes. The stirring is stopped, the supernatant is decanted, and the slurry is washed for 15 minutes in a nearly saturated solution of $K_2SiF_6$ in 49% HF. After the 15 minute washing step, stirring is stopped, the supernatant is decanted and the slurry is vacuum filtered, rinsed once with 75 mL glacial acetic acid and three times with 75 mL of acetone. The solid is dried for more than 30 minutes under vacuum and then annealed at 540° C. for 8 hours under a 20% fluorine:80% nitrogen atmosphere. The annealed powder is sifted through 280 mesh and then washed in a nearly saturated solution of $K_2SiF_6$ in 49% HF for 30 minutes. After the 30 minute washing step, stirring is stopped, the supernatant is decanted and the slurry is vacuum filtered, rinsed once with 75 mL glacial acetic acid, three times with 75 mL of acetone and then dried under vacuum.

Example 4: Slower Solution A Addition (C070616DTGAT(205))

Solution A was prepared by slowly adding 15.6 g of KF to a polypropylene beaker that contained 22.3 mL 49% HF. Caution as this process is exothermic. The solution was stirred magnetically for 5 minutes. Solution B was prepared by adding 13.4 mL of 35% $H_2SiF_6$ was added to 71 mL of 49% HF in a 500 mL polypropylene beaker. While the solution was stirred magnetically at 300 RPM, 1.8 g of $K_2MnF_6$ was added.

The contents of beaker A were added dropwise into beaker B over one minute and the resulting suspension is stirred for 3 minutes. The stirring is stopped, the supernatant is decanted, and the slurry is vacuum filtered, and washed for 15 minutes in a nearly saturated solution of $K_2SiF_6$ in 49% HF. After the 15 minute washing step, stirring is stopped, the supernatant is decanted and the slurry is vacuum filtered, rinsed once with 75 mL glacial acetic acid and three times with 75 mL of acetone. The solid is dried for more than 30 minutes under vacuum and then annealed at 540° C. for 8 hours under a 20% fluorine:80% nitrogen atmosphere. The annealed powder is sifted through 280 mesh and then washed in a nearly saturated solution of $K_2SiF_6$ in 49% HF for 30 minutes. After the 30 minute washing step, stirring is stopped, the supernatant is decanted and the slurry is vacuum filtered, rinsed once with 75 mL glacial acetic acid, three times with 75 mL of acetone and then dried under vacuum.

Example 5: Less Concentrated Solution A (C070616ETGAT(205))

Solution A was prepared by slowly adding 15.6 g of KF to a polypropylene beaker that contained 34 mL 49% HF. Caution as this process is exothermic. The solution was stirred magnetically for 5 minutes. Solution B was prepared by adding 13.4 mL of 35% $H_2SiF_6$ was added to 71 mL of 49% HF in a 500 mL polypropylene beaker. While the solution was stirred magnetically at 300 RPM, 1.8 g of $K_2MnF_6$ was added.

The contents of beaker A were quickly poured into beaker B and the resulting suspension was stirred for 3 minutes. The stirring was stopped, the supernatant was decanted, and the slurry was vacuum filtered, and washed for 15 minutes in a nearly saturated solution of $K_2SiF_6$ in 49% HF. After the 15 minute washing step, stirring was stopped, the supernatant was decanted and the slurry was vacuum filtered, rinsed once with 75 mL glacial acetic acid and three times with 75 mL of acetone. The solid was dried for more than 30 minutes under vacuum and then annealed at 540° C. for 8 hours under a 20% fluorine:80% nitrogen atmosphere. The annealed powder was sifted through 280 mesh and then washed in a nearly saturated solution of $K_2SiF_6$ in 49% HF for 30 minutes. After the 30 minute washing step, stirring was stopped, the supernatant was decanted and the slurry was vacuum filtered, rinsed once with 75 mL glacial acetic acid, three times with 75 mL of acetone and then dried under vacuum.

Example 6: Greater Amount of Solution A (C081016ATGAT(215))

The procedure of Example 2 was used except that 50 mL of Solution A containing KF at a concentration of 7 g/10 ml was used.

Example 7: Greater Amount of Solution A (C081016BTGAT(215))

The procedure of Example 2 was used except that 75 mL of Solution A containing KF at a concentration of 7 g/10 ml was used.

Example 8: Solution B Added to Solution A (C091316ATGAT(219))

The procedure of Example 2 was used except that Solution B was divided between two beakers and added to Solution A.

Example 9: 34 gKF into Si (C091316CTGAT(219))

The procedure of Example 2 was used except that Solution A was divided between two beakers which were poured simultaneously.

Example 10: Surfactant in Solution B (C092716ATGAT(222))

The procedure of Example 2 was used except that 1.3 g Tween20 was added to Solution B with stirring 1 minute before KF addition.

Example 11: Surfactant in Solutions A and B (C092716BTGAT(222))

The procedure of Example 9 was used except that 0.8 g Tween20 added to Solution A.

Example 12: Repeat of Example 2 (C092716CTGAT(222))

The procedure of Example 2 was repeated.

Example 13: Scale Up (C093016TGAT(223))

Solution A was prepared by slowly adding 95 g of KF to a polypropylene beaker that contained 136 mL 49% HF. Caution as this process is exothermic. The solution was stirred magnetically for 5 minutes. Solution B was prepared by slowly adding 53.4 mL of 35% $H_2SiF_6$ to 283 mL of 49% HF. While the solution was stirred magnetically at 300 RPM, 7.2 g of $K_2MnF_6$ was added.

The contents of solution A were quickly poured into solution B and the resulting suspension was stirred for 3 minutes. The stirring was stopped, the supernatant was decanted, and the slurry was vacuum filtered, rinsed with acetic acid and acetone, washed for 15 minutes in a nearly saturated solution of $K_2SiF_6$ in 49% HF. After the 15 minute washing step, stirring was stopped, the supernatant was decanted and the slurry was vacuum filtered, rinsed once with 75 mL glacial acetic acid and three times with 75 mL of acetone. The solid was dried for more than 30 minutes under vacuum and then annealed at 540° C. for 8 hours under a 20% fluorine:80% nitrogen atmosphere. The annealed powder was sifted through 280 mesh and then washed in a nearly saturated solution of $K_2SiF_6$ in 49% HF for 30 minutes. After the 30 minute washing step, stirring was stopped, the supernatant was decanted and the slurry was vacuum filtered, rinsed once with 75 mL glacial acetic acid, three times with 75 mL of acetone and then dried under vacuum.

Example 14: Continuous Process (C051716DTGAT(222))

Solution A was prepared by slowly adding 50.7 g KHF+ 71.9 g $C_2H_3KO_2$ to 195 mL 49% HF. Solution B was prepared by slowly adding 10.29 g $K_2MnF_6$ to 185 mL 49% HF. Solution C was prepared by adding 50 mL 35% $H_2SiF_6$ to 90 mL 49% HF. Solutions A, B, C were flowed into a reaction vessel at 45, 43, 32 mL/min respectively. The vessel was stirred at 300 rpm and nuclei formed almost instantaneously. When the volume of the suspension reached 50 mL, the stopcock was opened such that this 50 mL volume was maintained throughout the remainder of the reaction. The output from the reactor was collected in a beaker, particles are given time to settle and then decanted to a slurry. The slurry was vacuum filtered, rinsed with acetic acid and acetone, washed for 15 minutes in a nearly saturated solution of $K_2SiF_6$ in 49% HF. After the 15 minute washing step, stirring was stopped, the supernatant was decanted and the slurry was vacuum filtered, rinsed once with 75 mL glacial acetic acid and three times with 75 mL of acetone. The solid was dried for more than 30 minutes under vacuum and then annealed at 540° C. for 8 hours under a 20% fluorine:80% nitrogen atmosphere. The annealed powder was sifted through 280 mesh and then washed in a nearly saturated solution of $K_2SiF_6$ in 49% HF for 30 minutes. After the 30 minute washing step, stirring was stopped, the supernatant was decanted and the slurry was vacuum filtered, rinsed once with 75 mL glacial acetic acid, three times with 75 mL of acetone and then dried under vacuum.

Example 15: Water in Solution A (C101416AT)

Solution A was prepared by slowly adding 23.8 g of KF to a polypropylene beaker that contained 38 mL water. Caution as this process is exothermic. The solution was stirred magnetically for 5 minutes. Solution B was prepared by slowly adding 13.4 mL of 35% $H_2SiF_6$ to 71 mL of 49% HF in a 500 mL polypropylene beaker. While the solution was stirred magnetically at 300 RPM, 1.8 g of $K_2MnF_6$ was added.

The contents of solution A were split evenly between two beakers and simultaneously quickly poured into solution B and the resulting suspension was stirred for 3 minutes. The stirring was stopped, the supernatant was decanted, and the slurry was vacuum filtered, rinsed with acetic acid and acetone, washed for 15 minutes in a nearly saturated solution of $K_2SiF_6$ in 49% HF. After the 15 minute washing step, stirring was stopped, the supernatant was decanted and the slurry was vacuum filtered, rinsed once with 75 mL glacial acetic acid and three times with 75 mL of acetone. The solid was dried for more than 30 minutes under vacuum and then annealed at 540° C. for 8 hours under a 20% fluorine:80% nitrogen atmosphere. The annealed powder was sifted through 280 mesh and then washed in a nearly saturated solution of $K_2SiF_6$ in 49% HF for 30 minutes. After the 30 minute washing step, stirring was stopped, the supernatant was decanted and the slurry was vacuum filtered, rinsed once with 75 mL glacial acetic acid, three times with 75 mL of acetone and then dried under vacuum.

Example 16: Water and Surfactant in Solution A (C101416BTGAT)

Solution A was prepared by slowly adding 23.8 g of KF to a polypropylene beaker that contained 38 mL water+3 mL Novec™ 4200. Novec™ 4200 is an anionic fluorochemical surfactant in a 25% aqueous solution. Caution as this process is exothermic. The solution was stirred magnetically for 5 minutes. Solution A was prepared by slowly adding 13.4 mL of 35% $H_2SiF_6$ to 71 mL of 49% HF in a 500 mL polypropylene beaker. While the solution was stirred magnetically at 300 RPM, 1.8 g of $K_2MnF_6$ was added.

The contents of solution A were split evenly into two beakers and simultaneously quickly poured into solution B and the resulting suspension was stirred for 3 minutes. The stirring was stopped, the supernatant was decanted, and the slurry was vacuum filtered, rinsed with acetic acid and acetone, washed for 15 minutes in a nearly saturated solution of $K_2SiF_6$ in 49% HF. After the 15 minute washing step, stirring was stopped, the supernatant was decanted and the slurry was vacuum filtered, rinsed once with 75 mL glacial acetic acid and three times with 75 mL of acetone. The solid was dried for more than 30 minutes under vacuum and then annealed at 540° C. for 8 hours under a 20% fluorine:80% nitrogen atmosphere. The annealed powder was sifted through 280 mesh and then washed in a nearly saturated solution of $K_2SiF_6$ in 49% HF for 30 minutes. After the 30 minute washing step, stirring was stopped, the supernatant was decanted and the slurry was vacuum filtered, rinsed once with 75 mL glacial acetic acid, three times with 75 mL of acetone and then dried under vacuum.

Example 17: Higher Mn

Solution A was prepared by adding 23.8 g of KF to a polypropylene beaker that contained 34 mL 49% HF. Caution as this process is exothermic. The solution was stirred magnetically for 5 minutes. Solution B was prepared by adding 12.5 mL of 35% $K_2SiF_6$ to added to 76 mL of 49% HF in a 500 mL polypropylene beaker. While the solution was stirred magnetically at 300 RPM, 2.51 g of $K_2MnF_6$ was added.

The contents of beaker A were split evenly into two beakers and simultaneously quickly poured into beaker B and the resulting suspension was stirred for 3 minutes. The stirring was stopped, the supernatant was decanted, and the slurry was vacuum filtered, rinsed with acetic acid and acetone, washed for 15 minutes in a nearly saturated solution of $K_2SiF_6$ in 49% HF. After the 15 minute washing step, stirring was stopped, the supernatant was decanted and the slurry was vacuum filtered, rinsed once with 75 mL glacial acetic acid and three times with 75 mL of acetone. The solid was dried for more than 30 minutes under vacuum and then annealed at 540 C for 8 hours under a 20% fluorine:80% nitrogen atmosphere. The annealed powder was sifted through 280 mesh and then washed in a nearly saturated solution of $K_2SiF_6$ in 49% HF for 30 minutes. After the 30 minute washing step, stirring was stopped, the supernatant was decanted and the slurry was vacuum filtered, rinsed once with 75 mL glacial acetic acid, three times with 75 mL of acetone and then dried under vacuum. QE of the phosphors was determined in a silicone tape. The tapes were prepared by mixing 500 mg of the material to be tested with 1.50 g silicone (Sylgard 184). The mixture was degassed in a vacuum chamber for about 15 minutes. The mixture (0.70 g) was poured into a disc-shaped template (28.7 mm diameter and 0.79 mm thick) and baked for 30 minutes at 90° C. The sample was cut into squares of size approximately 5 mm×5 mm for testing. QE was measured at excitation wavelength of 450 nm and is reported relative to a reference sample of $Mn^{4+}$ doped $K_2SiF_6$ with 0.68% Mn and a particle size of 28 microns from a commercial source. Lifetime was determined using an Edinburgh FS900 Spectrometer by fitting a single exponential decay to the measured data between 1.4 ms and 67 ms after excitation. The amount of manganese incorporated in the phosphor was determined by inductively coupled plasma mass spectrometry (ICP-MS), and is reported as weight %, based on total weight of the phosphor material. For Examples 1-8, and 10-13, particle size based on volume distribution was measured using a Horiba LA-960 Laser Scattering Particle Size Distribution Analyzer. Results are shown in Table 1.

TABLE 1

| Ex. No. | Sample code | % Mn | QE | D10/50/90, μm | TEM p.s. | Lifetime (ms) | R631 |
|---|---|---|---|---|---|---|---|
| 1 | C070616ATGAT(205) | 2.26 | 102.4% | 8/12/18 | | 8.341 | |
| 2 | C070616BTGAT(205) | 2.27 | 102.6% | 4/7/14 | | 8.358 | |
| 3 | C070616CTGAT(205) | 2.46 | 102.3% | 19/25/33 | | 8.355 | |
| 4 | C070616DTGAT(205) | 1.88 | 89.2% | 12/20/31 | | 8.064 | |
| 5 | C070616ETGAT(205) | 2.09 | 101.2% | 10/14/21 | | 8.312 | |
| 6 | C081016ATGAT(215) | 1.86 | 99.6% | 6/8/15 | | 8.395 | 36.2% |
| 7 | C081016BTGAT(215) | 1.89 | 94.6% | 5/9/16 | | 8.363 | 35.7% |
| 8 | C091316ATGAT(219) | 1.94 | 104.0% | 6/9/16 | | 8.402 | 34.0% |
| 9 | C091316CTGAT(219) | 1.88 | 104.3% | | | 8.427 | 36.2% |
| 10 | C092716ATGAT(222) | 1.84 | 100.0% | 2/5/8 | | 8.454 | 37.5% |
| 11 | C092716BTGAT(222) | 1.78 | 102.0% | 3/5/9 | | 8.465 | 37.4% |
| 12 | C092716CTGAT(222) | 1.82 | 102.7% | 5/8/14 | | 8.449 | 35.2% |
| 13 | C093016TGAT(223) | 1.86 | 101% | 5/9/16 | | 8.434 | 34.2% |
| 14 | C051716DTGAT(222) | 2.71 | 94 | | | 7.984 | 25.3% |
| 15 | C101416ATGAT | 2.6 | na | | | | |
| 16 | C101416BTGAT | 2.58 | na | | | | |
| 17 | C062916TGAT(203) | 3.31 | 99 | 6/11/18 | | 8.3 | 26.4 |
| 18 | GRC090817T | | | | <50 nm | | |
| 20 | S082517 | | | | <200 nm | | |

For Examples 9 and 14-16, particle size based on a number distribution was measured by an optical microscopy method. The sample powder in the container was shaken before any powder extraction was performed. A small spatula was used to extract a very small amount of powder from the vial and placed on a glass slide. A small drop of dispersion oil was placed on a glass cover slip and was carefully placed on the powder samples on the slide. The dispersion oil has a numerical aperture of about 1.6 so that the particles show up with good contrast during imaging. The cover slip was pressed with an eraser equipped pencil and rotated several times in order to disperse the powder on the slide. Three individual slides are made with each sample of powder by extracting a small volume of powder three different times (as opposed to making 3 slides from one extraction of powder). Three to five areas for image analysis are selected from each slide in order to minimize sampling bias. The slide was then placed on a high resolution camera equipped transmitted light microscope. The sample was scanned at low magnifications in order to find areas with the best dispersion (less agglomerates) and to ensure that the full range of particles are captured. An appropriate objective lens was selected that resolves the preponderance of particles on the slide. The limit of optical resolution was approximately 0.25 µm. The microscope was interfaced to a workstation equipped with Clemex Vision image analysis software which permits the image acquisition, processing, and measurement of the particles on the slide. The actual projection of the particles are imaged using transmitted illumination and the area of that projection was what was measured with subsequent assumptions made about the shape. Most often a spherical shape was assumed in order to generate volumetric data. Results are shown in Table 2.

TABLE 2

| Example no. | Particle Size Distribution, Number-based | | | |
|---|---|---|---|---|
| | Mean p.s., µm | Std. dev. | Min. p.s., µm | Max. p.s., µm |
| 13 | 6.2 | 4.2 | 0.4 | 20.1 |
| 14 | 3.7 | 1.3 | 0.2 | 8.2 |
| 15 | 3.1 | 1.2 | 0.4 | 8.3 |
| 16 | 3.7 | 1.9 | 0.4 | 12.3 |

Value of Hammett Acidity Function of Solutions

The value of the Hammett acidity function is calculated using equation (1):

$$H_0 = pK_{BH^+} + \log\frac{[B]}{[BH^+]} \quad (1)$$

where
$H_0$ is the value of the Hammett Acidity function
[B]=concentration of weak base B
[BH$^+$]=concentration of conjugate acid of weak base B
$pK_{BH+}$=dissociation constant of conjugate acid The concentration of neutral base [B] and conjugated acid of the weak base [BH+] are measured using the absorbance of these species in the test solution. Absorbance of neutral base is proportional to the concentration of neutral species and absorbance decreases with increased protonation of the base. The absorbance of neutral base will reduce to zero when all base species are protonated. The choice of the base for any given acid solution is made based on the ability of the acid to partially protonate the weak base. If the acid to strong that it completely protonates the weak base, another base with weaker strength should be chosen of the hammett's acidity measurements.

The experimental procedure is as follows: A known weight of the weak base (B) was added to two different bottles (A & B). A known volume of a reference solution (Ref1) that dissolves the base but does not protonate the base was added to bottle A and allow the indicator to dissolve in the solution. This reference solution was typically a weaker acid than our test solution. Once the base was fully dissolved the absorbance of the solution ($A_{Ref}$) was measured using UV-Vis spectrometer. A known volume of the test solution was added to bottle B. Once the base was fully dissolved the absorbance of the solution ($A_{test}$) was measured using UV-Vis spectrometer. Since the absorbance is proportional to the concentration of the neutral base in the solution, the ratio of [BH$^+$]/[B] for the test solution was calculated using equation (3):

$$\frac{[BH^+]}{[B]} = \frac{(A_{Ref} - A_{test})}{A_{Ref}} \quad (3)$$

where
$A_{Ref}$=Absorbance of reference solution at a specific wavelength
$A_{test}$=Absorbance of test solution at a specific wavelength
The values of [BH$^+$]/[B] and base strength of the weak base are used to calculate the hammett's acidity of the test solution using equation 1.

Figure 6:
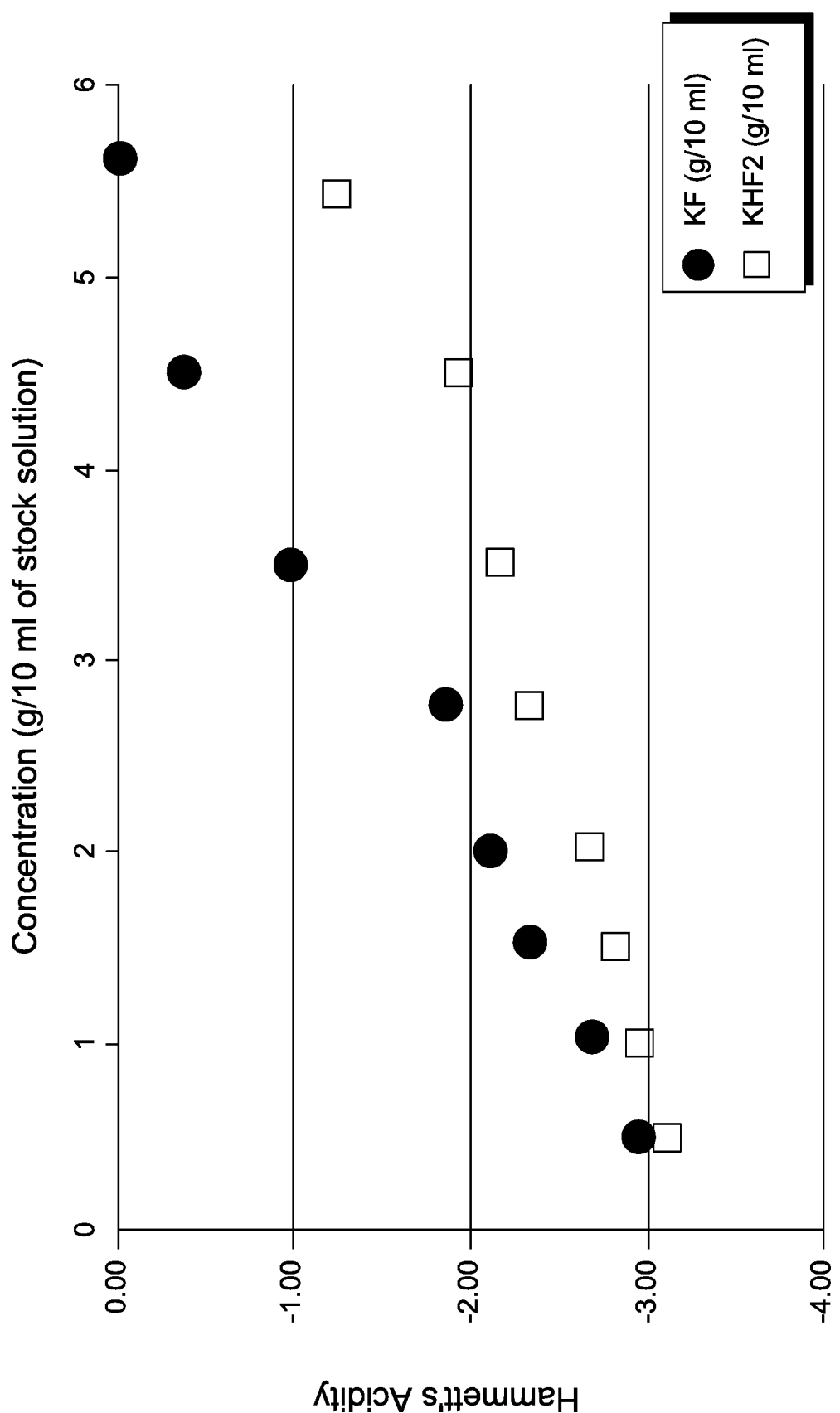
FIG. 6 is a graph of the value of the Hammett acidity function of KF and $KHF_2$ solutions in 48 wt. % hydrofluoric acid

Results:

FIG. 6 shows the change in Hammett's acidity value as the concentration of potassium salts is varied. It can be seen that acidity of KF or KHF$_2$ solutions in 48 wt. % HF decreases with increasing concentrations.

The value of the Hammett acidity function of solutions of different potassium sources in 48 wt. % hydrofluoric acid is shown in Table 3. Acidity of equimolar K salts dissolved in 48% HF decreases in the following order:

KHSO4>KHF2>KF>K2CO3>KOH

TABLE 3

| Potassium Source | Hammett's Acidity |
|---|---|
| KHSO$_4$ | −3.11 |
| KHF$_2$ | −2.05 |
| KF | −0.85 |
| K$_2$CO$_3$ | −0.11 |
| KOH | 1.25 |

The value of the Hammett acidity function of mixtures of solutions of 48 wt. % hydrofluoric acid and 35 wt. % fluorosilicic acid are shown in table 4. As the amount of HF added to H$_2$SiF$_6$ increased, the acidity increased and addition of water to H$_2$SiF$_6$ solution resulted in a decrease in acidity.

TABLE 4

| Volume ratio of H$_2$SiF$_6$ & HF | Molarity of [SiF$_6$]$^{2-}$ | Molarity of HF | Hammett's Acidity |
|---|---|---|---|
| H$_2$SiF$_6$:HF = 1:0 | 3.18 | 0.00 | −2.48 |
| H$_2$SiF$_6$:HF = 1:1 | 1.59 | 13.73 | −2.80 |
| H$_2$SiF$_6$:HF = 1:2 | 1.06 | 18.31 | −2.88 |
| H$_2$SiF$_6$:HF = 1:3 | 0.80 | 20.60 | −2.95 |
| H$_2$SiF$_6$:HF = 1:4 | 0.64 | 21.97 | −2.99 |
| H$_2$SiF$_6$:HF:H$_2$O = 1:2:1 | 0.80 | 13.73 | −1.93 |

Example 18: Preparation Using Potassium Citrate

Solution A was prepared by mixing 100 mL H$_2$O and 15 g potassium citrate in a 250 mL polypropylene beaker. Solution B was prepared by mixing 6 mL 35% H$_2$SiF$_6$ (aq), 12 ml 49% HF, and 0.8 g of K$_2$MnF$_6$. The contents of Solution B were poured into Solution A. The resulting suspension was centrifuged, supernatant decanted, resuspended in acetic acid, and centrifuged. The supernatant was decanted, resuspended in acetone, and centrifuged, and the decant/resuspend in acetone/centrifuge steps were repeated. The product from each of the four centrifugations was collected and vacuum dried. The emission spectra of the powder was measured and was found to be identical to that of standard size PFS. TEM analysis showed that the particles were uniform, with particle size less than 50 nm.

Example 19: Microemulsion Method for
Preparation of KMgF$_3$-Coated K$_2$SiF$_6$:Mn Phosphor Two reverse microemulsions, denoted Microemulsions I and II, are prepared separately. Microemulsions I and II contain 10 g of cetyltrimethylammonium bromide dissolved in 40 g of 2-octanol (weight ratio is 1:4). This mixture is stirred magnetically for 1 h, and then aqueous salt solution I [0.0025 mol (0.641 g) Mg(NO$_3$)$_2$*6H$_2$O and 0.003 mol (0.3033 g) KNOB dissolved in 4.6 mL H$_2$O] and aqueous salt solution II [0.01 mol (0.3704 g) NH$_4$F is dissolved in 4.6 mL H$_2$O] are poured slowly into microemulsion I and II, respectively. The water content in the microemulsions is 8.6% (w/w). These two microemulsions are stirred separately for two hours, and then 3.6 g of K$_2$SiF$_6$:Mn phosphor is added to microemulsion I. Microemulsion I and II are combined at room temperature and stirred for 5-15 min, and the product is then vacuum filtered and rinsed three times with ethanol. The coated phosphor is then dried under vacuum.

Examples 20-23: Microemulsion Preparation of
K$_2$SiF$_6$ and K$_2$SiF$_6$:Mn

Procedure

Two separate beakers were used in the synthesis of nanoparticles. In both beakers, A and B, CTAB was dissolved in 2-octanol and stirred for 1 hr. Then the other components of beakers A and B listed in Table 5 were combined and added to the CTAB/octanol. The contents of beaker A were added to beaker B and the mixture was stirred until the reaction was complete. Then stirring was stopped and the contents settled. The supernatant was decanted and the product washed with ethanol. The as formed K$_2$SiF$_6$ was washed and decanted in ethanol (5×) until all the excess CTAB and 2-octanol was washed off, leaving only nanoparticles and ethanol.

TEM showed nicely formed particles having particle size in the 200-500 nm range with some particles that were submicron in size, with particle size less than about 200 nm.

TABLE 5

| Beaker A | Beaker B |
|---|---|
| Example 20: K$_2$SiF$_6$ Nanoparticles | |
| 40 g 2-Octanol | 40 g 2-Octanol |
| 10 g CTAB | 10 g CTAB |
| 0.5055 g KNO$_3$ | 0.4454 NH$_4$SiF$_6$ |
| 4.6 mls H$_2$O | 4.6 mls H$_2$O |
| Example 21: K$_2$SiF$_6$:Mn Nanoparticles | |
| 40 g 2-Octanol | 40 g 2-Octanol |
| 10 g CTAB | 10 g CTAB |
| 0.5055 g KNO$_3$ | 0.4454 NH$_4$SiF$_6$ |
| 4.6 mls H$_2$O | 4.6 mls H$_2$O |
| 0.006 g K$_2$MnF$_6$ | |
| Example 22: K$_2$SiF$_6$:Mn Nanoparticles | |
| 40 g 2-Octanol | 40 g 2-Octanol |
| 10 g CTAB | 10 g CTAB |
| 0.3905 g KHF$_2$ | 0.3602 H$_2$SiF$_6$ |
| 0.006 g K$_2$MnF$_6$ | 4.6 mls 49% HF |
| 4.6 mls 49% HF | |
| Example 23: K$_2$SiF$_6$:Mn Nanoparticles | |
| 40 g 2-Octanol | 40 g 2-Octanol |
| 10 g CTAB | 10 g CTAB |
| 0.3905 g KHF$_2$ | 0.3602 H$_2$SiF$_6$ |
| 0.006 g K$_2$MnF$_6$ | 2.3 mls 49% HF |

TABLE 5-continued

| Beaker A | Beaker B |
|---|---|
| 2.3 mls 49% HF | 2.3 mls acetic acid |
| 2.3 mls acetic acid | |

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for preparing a Mn$^{+4}$ doped phosphor of formula I $$A_x[MF_y]:Mn^{+4} \qquad I$$

the process comprising combining a first solution comprising a source of A and a second solution comprising H$_2$MF$_6$ in the presence of a source of Mn, to form the Mn$^{+4}$ doped phosphor;
wherein
A is Li, Na, K, Rb, Cs, or a combination thereof;
M is Si, Ge, Sn, Ti, Zr, Al, Ga, In, Sc, Y, La, Nb, Ta, Bi, Gd, or a combination thereof;
x is the absolute value of the charge of the [MF$_y$] ion;
y is 5, 6 or 7; and
wherein a value of a Hammett acidity function of the first solution is at least −0.9; and
wherein at least one of the first solution and the second solution additionally comprises a surfactant.

2. A process according to claim 1, wherein the value of the Hammett acidity function of the first solution is at least −0.5.

3. A process according to claim 1, wherein concentration of the source of A in the first solution is at least 6M.

4. A process according to claim 1, wherein the concentration of the source of A in the first solution is at least 7.8M.

5. A process according to claim 1, wherein a molar ratio of A to M is at least 7/1.

6. A process according to claim 1, wherein a molar ratio of A to M is at least 9/1.

7. A process according to claim 1, wherein the first and second solutions are combined over a period of 10 seconds or less.

8. A process according to claim 1, wherein the source of A is KF.

9. A process according to claim 1, wherein the first solution is free of HF.

10. A process according to claim 1, wherein the phosphor of formula I is K$_2$SiF$_6$:Mn.

11. A process for preparing a Mn$^{+4}$ doped phosphor of formula I, $$A_x[MF_y]:Mn^{+4} \qquad\qquad I$$

the process comprising
gradually adding a first solution comprising a source of A and a second solution comprising a source of a source of M to a reactor in the presence of a source of Mn, to form a product liquor comprising the Mn$^{+4}$ doped phosphor; and
gradually discharging the product liquor from the reactor; wherein
A is Li, Na, K, Rb, Cs, or a combination thereof;
M is Si, Ge, Sn, Ti, Zr, Al, Ga, In, Sc, Y, La, Nb, Ta, Bi, Gd, or a combination thereof;
x is the absolute value of the charge of the [MF$_y$] ion;
y is 5, 6 or 7; and wherein
a value of a Hammett acidity function of the first solution is at least −1.3;
a value of a Hammett acidity function of the second solution is at least −3;
a ratio of a volume of a 35% H$_2$SiF$_6$ solution to a volume of a 48% HF solution in the second solution is at least 1:2.5; and
wherein at least one of the first solution and the second solution additionally comprises a surfactant.

12. A process according to claim 11, wherein the product liquor is gradually discharged from the reactor while maintaining a volume thereof at less than 100 ml.

13. A process according to claim 11, wherein the value of the Hammett acidity function of the first solution is at least −0.9.

14. A process according to claim 11, wherein the source of A is KF.

* * * * *